United States Patent
Tripsas et al.

[11] Patent Number: 6,063,665
[45] Date of Patent: May 16, 2000

[54] METHOD FOR SILICON SURFACE CONTROL FOR SHALLOW JUNCTION FORMATION

[75] Inventors: Nicholas H. Tripsas; David K. Foote, both of San Jose, Calif.

[73] Assignee: Advanced Micro Devices, Inc., Sunnyvale, Calif.

[21] Appl. No.: 08/986,463

[22] Filed: Dec. 8, 1997

[51] Int. Cl.$^7$ .................................................. H01L 21/336
[52] U.S. Cl. .......................................... 438/260; 438/301
[58] Field of Search ................................... 257/328, 532; 438/348, 328, 234, 260, 232, 259, 443, 763, 301

[56] References Cited

U.S. PATENT DOCUMENTS

| | | | |
|---|---|---|---|
| 5,008,212 | 4/1991 | Chen | 437/43 |
| 5,021,358 | 6/1991 | Flanner et al. | 437/57 |
| 5,420,051 | 5/1995 | Bohr et al. | 437/31 |
| 5,552,332 | 9/1996 | Tseng et al. | 437/41 |
| 5,674,788 | 10/1997 | Wristers et al. | 437/239 |

*Primary Examiner*—John F. Niebling
*Assistant Examiner*—Walter L Lindsay, Jr.
*Attorney, Agent, or Firm*—Sawyer Law Group LLP

[57] ABSTRACT

A system and method for providing a small device formed on a semiconductor is disclosed. The method and system include controlling the surface by providing a very thin oxide layer and providing a shallow implant through the very thin oxide layer.

6 Claims, 2 Drawing Sheets

METHOD FOR SILICON SURFACE CONTROL FOR SHALLOW JUNCTION FORMATION

FIELD OF THE INVENTION

The present invention relates to semiconductor processing and more particularly to a method and system for controlling the surface for a shallow junction implant.

BACKGROUND OF THE INVENTION

Shallow junction implants are used in the formation of devices such as deep submicron metal oxide semiconductor ("MOS") transistors. In order to provide a shallow junction implant, a controlled surface is used to prevent contaminants from reaching the junction. Conventional processing methods in manufacturing provide a screening oxide prior to implantation. This screening oxide is on the order of fifty to one hundred Angstroms thick. The screening oxide is typically provided by exposing the silicon to oxygen gas at an elevated temperature, typically between eight hundred and one thousand degrees Centigrade. The screening oxide not only prevents contaminants from reaching the underlying silicon, but also reduces ion channeling.

Currently, semiconductor technology has been increasingly driven to lower device size. As the feature size shrinks, the gate length and, therefore, junctions shrink For example, gate lengths are shrinking to be on the order of 0.13 microns and below. Consequently, a method for providing shallow junction implants for smaller devices is needed.

The screening oxide may not be scaleable to smaller feature sizes. The thickness of the screening oxide requires higher implant energies which result in deeper implants. Consequently, screening oxides of conventional thicknesses are not used. In addition, the process for forming the screening oxide becomes difficult to control when lower oxide thicknesses are desired, often resulting in films of an uncontrolled and nonuniform thickness at thicknesses lower than the present screening oxides.

Most research in shallow junction implants for smaller feature sizes provides a controlled surface for implantation by stripping the screening oxide or native oxide from the surface of the silicon on which the junction is to be formed. This procedure is performed just prior to implantation. Thus, the shallow junction implant can be performed without interference from a native surface oxide. However, this procedure is difficult to implement in a large scale manufacturing process for two reasons. First, it requires cleaning a wafer prior to implantation, which is not conventionally done. Second, to limit native oxide growth prior to implantation, the implantation must occur within a predetermined time after the wafer is cleaned. Thus, a queue time, a maximum time specified between processes, is introduced. A manufacturing facility will, therefore, have to coordinate the cleaning and implantation steps to occur with the queue time. This introduces a strain on the manufacturing facility's resources and may result discarding or reworking of substantial quantities of devices when the queue time cannot be met. In addition, the beneficial control of contaminants provided by a screening oxide is lost.

Accordingly, what is needed is a system and method for controlling the surface of a semiconductor prior to a shallow junction implant that is suitable for a manufacturing process and capable of use with smaller feature sizes. The present invention addresses such a need.

SUMMARY OF THE INVENTION

The present invention provides a method and system for providing a small device formed on a semiconductor. The method and system comprise controlling the surface by providing a very thin oxide layer and providing a shallow implant through the very thin oxide layer.

According to the system and method disclosed herein, the present invention controls the surface for a shallow junction implant suitable for a manufacturing process and small device sizes, thereby increasing overall system performance.

DETAILED DESCRIPTION OF THE INVENTION

The present invention relates to an improvement in semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
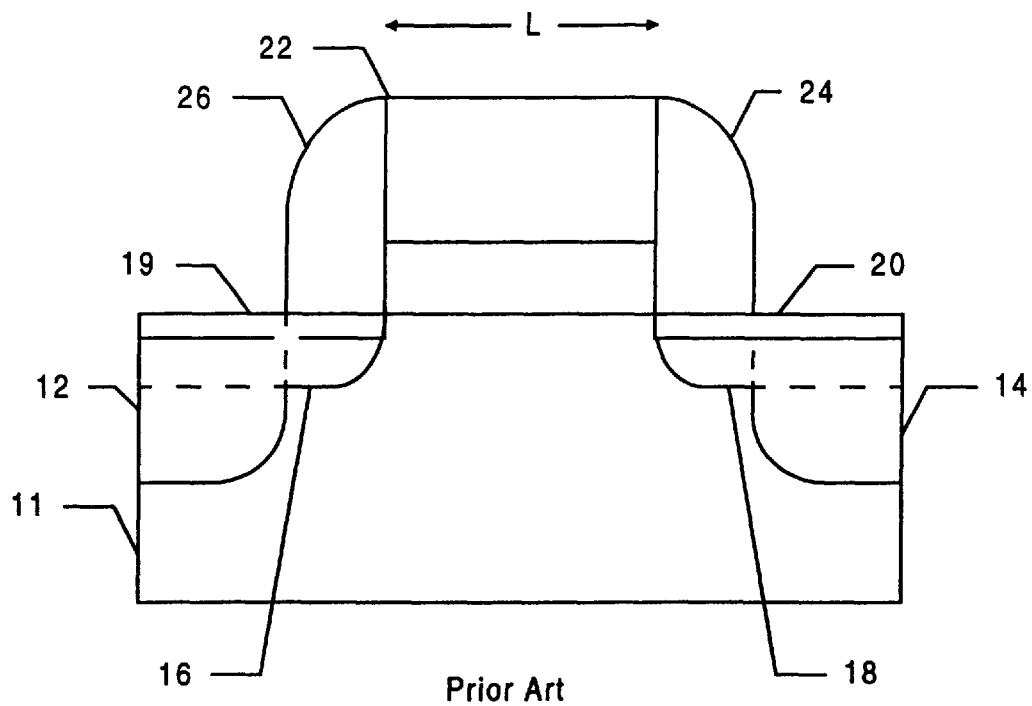
FIG. 1 is a block diagram of a MOS transistor.

Shallow implants are used in the formation of semiconductor devices. FIG. 1 is a block diagram of a deep submicron metal oxide semiconductor ("MOS") transistor 10 which uses shallow implants during formation. The MOS transistor 10 is built on a semiconductor substrate 11, such as silicon. The transistor includes source 12, drain 14, and gate 22. The gate 22 is surrounded by spacers 26. Shallow implants are used to form the source extension 16 and the drain extension 18. Typically, the extensions 16 and 18 are between five hundred and one thousand Angstroms deep. Conventional processing methods use a low energy Boron or $BF_2$ implant to form $P^+$ extensions and an arsenic implant to form $N^+$ extensions.

The MOS transistor 10 includes a screening oxides 19 and 20. The screening oxides 19 and 20 are on the order of fifty to one hundred Angstroms thick. The screening oxides 19 and 20 are typically provided by exposing the silicon to oxygen gas at an elevated temperature. The screening oxide not only prevents contaminants from reaching the underlying silicon, but also reduces ion channeling. Thus, the screening oxide helps to control the surface of the semiconductor substrate 11 where the shallow implants will be formed.

Although the MOS transistor 10 is functional, one of ordinary skill in the art will realize that semiconductor technology has been increasingly driven to lower device size. As the feature size shrinks, the gate length, L, of the semiconductor transistor 10 shrinks. As the gate length decreases, the shallow junctions extensions 16 and 18 decrease in depth to control short channel effects. Consequently, a method for providing shallow junction implants for smaller devices is needed.

One of ordinary skill in the art will realize that the provision of screening oxides 19 and 20 using oxygen gas is not scaleable to smaller feature sizes. Because of the thickness of the screening oxides 19 and 20, a higher implant energy is required to ensure that implants cross the screening oxides 19 and 20 to reach the semiconductor 11. The higher implant energy results in a broadening of the implant peak and, therefore, deeper implants.

The technique used for providing the screening oxides 19 and 20, exposure to oxygen at an elevated temperature, becomes difficult to control when lower thicknesses of the screening oxide 19 and 20 are desired. Thus, thinner screening oxides 19 and 20 formed using oxygen may result in films of an uncontrolled and nonuniform thickness. Where the screening oxide thickness is non-uniform, the doping of the semiconductor below the screening oxide 19 or 20 may be non-uniform because the amount of dopant that penetrates the screening oxide 19 or 20 depends in part on the thickness of the screening oxide.

Figure 2:
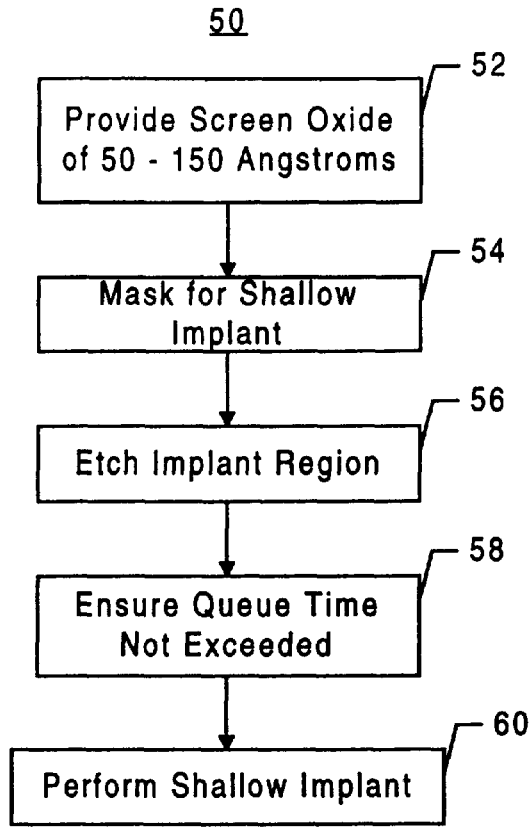
FIG. 2 is a is a flow chart depicting a conventional method for processing a shallow junction implant.

Some conventional methods overcome problems due to the screening oxides 19 and 20 by removing the screening oxides 19 and 20. FIG. 2 depicts a conventional method 50 for providing a shallow junction implant at lower device thicknesses. A screening oxide may be provided, for example during a sealing oxidation of the gate 22, in step 52. However, the step of providing the screening oxide during gate oxidation may be skipped in some conventional processes. Note that even if a screening oxides 19 and 20 are not provided, the etching step 58 is performed to remove any native oxide that has formed on the surface of the silicon. The semiconductor 11 is then masked for the shallow implant via step 54. Via step 56, the semiconductor 11 is etched via step 58 to remove the screening oxides 19 and 20 or any native oxide from the surface of the silicon 11 on which the junction is to be formed. This procedure must be performed within a preset time, called a queue time, of performing a shallow implant. Thus, via step 58 it is ensured that the queue time has not been exceeded. It is estimated that the queue time may be in the range of four or less hours to twelve or more hours. Finally, the shallow implant is performed in step 60.

Although this procedure is capable of providing shallow implants at lower device sizes, one of ordinary skill in the art will understand that this procedure is difficult to implement in a large scale manufacturing process. The semiconductor 11 is etched prior to implantation, which was not previously conventionally done. In addition, to prevent native oxide growth on the semiconductor 11 prior to implantation, the implantation must occur within the queue time after the semiconductor 11 is etched. A manufacturing facility will, therefore, have to coordinate the cleaning and implantation steps to occur within the queue time. This introduces a strain on the manufacturing facility's resources and may result discarding or reworking of substantial quantities of devices when the queue time cannot be met. In addition, contaminants introduced during the implant process can no longer be easily removed. If the screening oxides 19 or 20 are not removed, contaminants are partially controlled because contaminants tend not to diffuse from the screening oxide 19 or 20 to the underlying surface. Removal of contaminants also becomes more difficult when the screening oxides 19 or 20 are removed because aggressive cleaning techniques, including stripping the screening oxides 19 or 20, are made possible by the presence of the screening oxides 19 or 20.

The present invention provides for a method and system for providing a device having a lower device size on a semiconductor. The method and system comprise controlling the surface by providing a very thin oxide layer and providing a shallow implant through the very thin oxide layer. The present invention will be described in terms of extension implants for a MOS transistor and the use of specific oxidizing agents. However, one of ordinary skill in the art will readily recognize that this method and system will operate effectively for other types of devices and other agents having the requisite properties.

Figure 3:
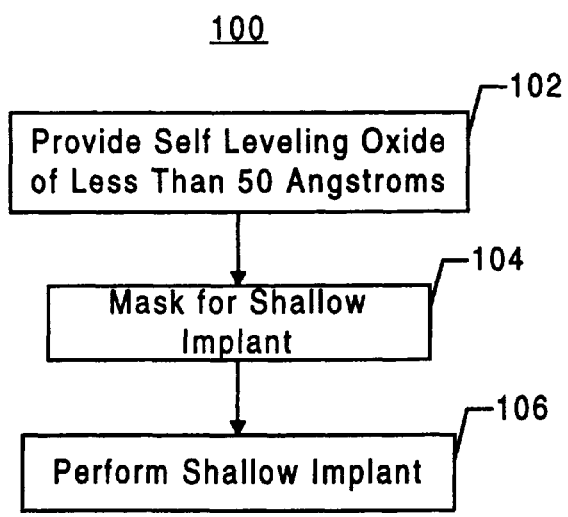
FIG. 3 is a flow chart depicting a method for processing a shallow junction implant in accordance with the present invention.

To more particularly illustrate the method and system in accordance with the present invention, refer now to FIG. 3 depicting a flow chart of one embodiment a method 100 in accordance with the present invention. First, a very thin oxide is provided via step 102. Step 102 is performed such that an oxide layer less than fifty angstroms thick of uniform thickness is formed. The very thin oxide layer controls the surface of the semiconductor, preventing contaminants from reaching the surface. In a preferred embodiment, this oxide layer can be controllably fabricated down to ten Angstroms or less. More generally, the oxide layer provided will be approximately fifteen to twenty Angstroms thick.

In a preferred embodiment, step 102 is performed by using nitric oxide or nitrous oxide to form the oxide layer. These oxidizing gases are virtually self limiting because the oxidizing species do not diffuse well through the oxide formed. As a result, the thickness of the oxide layer formed can be very closely controlled. In addition, because the nitrous oxide and nitric oxide grown films are virtually self limiting, the oxide layers formed are self leveling. The oxidizing species will penetrate the thinner oxide regions more readily than thicker regions, resulting in a higher rate of oxidation in thin regions compared to thick regions. As a result, the thickness of the oxide layer grown will become more uniform as oxide growth proceeds. Thus, a very thin oxide layer of uniform thickness can be provided.

In a preferred embodiment, the exposure to nitric oxide or nitrous oxide in step 102 occurs at an elevated temperature. Typically, this temperature will be on the order of seven hundred and fifty to one thousand degrees Centigrade. The time required to grow the very thin oxide layer of uniform thickness may vary with the temperature at which step 102 is performed and the desired thickness of the very thin oxide layer. In a rapid thermal process, the step 102 of providing the very thin oxide layer takes approximately ten seconds to two minutes. In a furnace, the step 102 of providing the very thin oxide layer may take approximately five to sixty minutes.

The mask for the shallow implant is then provided via step 104. The shallow implant is then performed in step 106. Because the oxide layer grown via step 102 is thin and of uniform thickness, the step of etching the screening oxide 16 or 18 from the implant region, step 56 of the conventional method 50, and the step of ensuring that the queue time has not been exceeded, step 58 of the conventional method 50, can be omitted.

Figure 4:
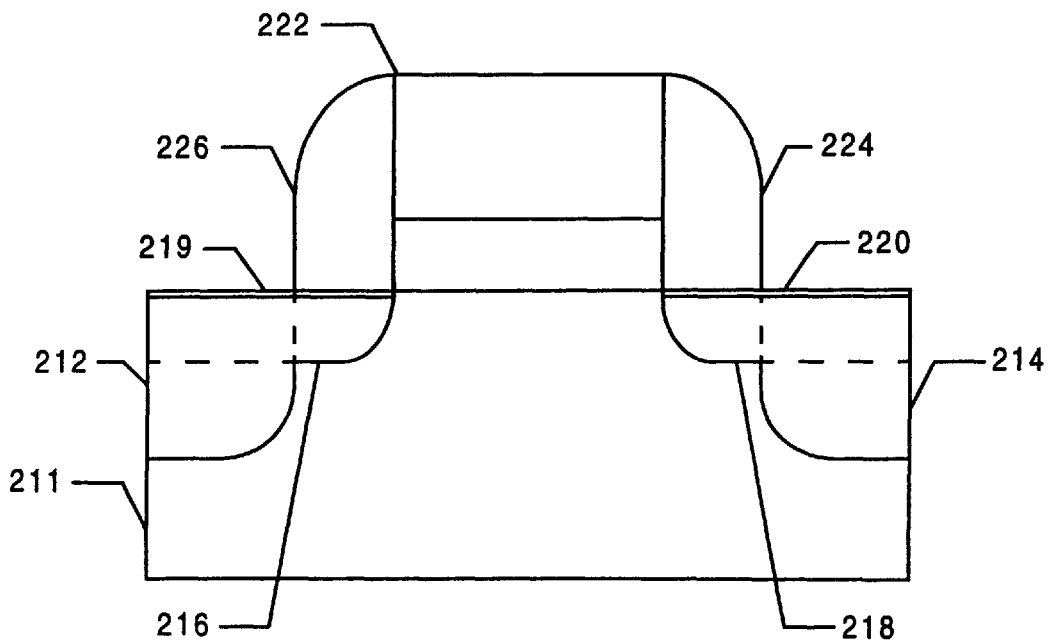
FIG. 4 is a block diagram of a MOS transistor in accordance with present invention.

FIG. 4 depicts a small MOS transistor 200 grown in accordance with the present invention. The MOS transistor 200 includes source 212, drain 214, extensions 216 and 218, and very thin oxide layers 219 and 220. The MOS transistor 200 further includes a gate 222, and spacers 224 and 226.

Because the oxide layers 219 and 220 were grown as discussed with respect to step 102 of FIG. 3, the oxide layers 219 and 220 are very thin and have uniform thickness. In a preferred embodiment, the oxide layers 219 and 220 are on the order of fifteen to twenty Angstroms thick. Because the oxide layers 219 and 220 are thin, there is a negligible effect on shallow implants, such as the implants forming extensions 216 and 218. Therefore, a higher implant energy is not required and the implant peak is not broadened. Moreover, because the thickness of oxide layers 219 and 220 is uniform, the implant is uniform. Consequently, a controlled surface for a shallow implant in a small device is provided without requiring additional etches or specifying an additional queue time.

A method and system has been disclosed for providing a very thin oxide layer for controlling the surface for a shallow implant in a small device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a small device formed on a semiconductor having a surface, the method comprising the steps of:

controlling the surface of the semiconductor by providing a very thin oxide layer that is less than fifty Angstroms thick, the very thin oxide layer being formed by exposing the semiconductor to a substantially self limiting oxidizing species to provide the very thin oxide layer; and providing a shallow implant through the very thin oxide layer.

2. A method for providing a small device formed on a semiconductor having a surface, the method comprising the steps of:

controlling the surface of the semiconductor by providing a very thin oxide layer that is between approximately ten and twenty Angstroms thick, the very thin oxide layer being formed by exposing the semiconductor to a substantially self limiting oxidizing species to provide the very thin oxide layer; and providing a shallow implant through the very thin oxide layer.

3. The method of claim 1 wherein in the oxidizing species is nitric oxide.

4. The method of claim 3 further comprising the step of:

providing a shallow implant mask.

5. The method of claim 2 wherein the oxidizing species is nitrous oxide.

6. The method of claim 5 further comprising the step of:

providing a shallow implant mask.

* * * * *